United States Patent
Rahim et al.

(10) Patent No.: US 7,291,546 B1
(45) Date of Patent: *Nov. 6, 2007

(54) METHOD AND APPARATUS FOR REDUCING CHARGE LOSS IN A NONVOLATILE MEMORY CELL

(75) Inventors: Irfan Rahim, Milpitas, CA (US); Fangyun Richter, San Jose, CA (US)

(73) Assignee: Altera Corporation, San Jose, CA (US)

( * ) Notice: Subject to any disclaimer, the term of this patent is extended or adjusted under 35 U.S.C. 154(b) by 102 days.

This patent is subject to a terminal disclaimer.

(21) Appl. No.: 10/872,618

(22) Filed: Jun. 21, 2004

Related U.S. Application Data

(63) Continuation of application No. 10/156,514, filed on May 28, 2002, now Pat. No. 6,773,987.

(60) Provisional application No. 60/332,718, filed on Nov. 17, 2001.

(51) Int. Cl.
*H01L 21/8247* (2006.01)

(52) U.S. Cl. ............... 438/532; 438/593; 438/582; 438/258; 257/E27.103

(58) Field of Classification Search ......... 438/532, 438/593, 582, 258, FOR. 203; 257/E27.103
See application file for complete search history.

(56) References Cited

U.S. PATENT DOCUMENTS

| 5,036,018 | A | * | 7/1991 | Mazzali ............ 438/201 |
| 5,898,006 | A | * | 4/1999 | Kudoh ............. 438/275 |
| 5,899,718 | A | * | 5/1999 | Chen et al. ........ 438/264 |
| 5,911,105 | A | * | 6/1999 | Sasaki ............ 438/258 |
| 5,970,338 | A | * | 10/1999 | Tempel ........... 438/241 |
| 6,124,157 | A | * | 9/2000 | Rahim ............ 438/201 |
| 2001/0001075 | A1 | * | 5/2001 | Ngo et al. ......... 438/257 |
| 2002/0008019 | A1 | * | 1/2002 | Nishioka ......... 204/192.37 |
| 2002/0070407 | A1 | * | 6/2002 | Kobayashi ........ 257/317 |
| 2003/0049905 | A1 | * | 3/2003 | Nitta et al. ....... 438/258 |

OTHER PUBLICATIONS

Rydberg, M., et al, "Long-Term Stability and Electrical Properties of Compensation Doped Poly-Si IC-Resistors", IEEE Transaction on Electron Devices, vol. 47, No. 2, Feb. 2000, pp. 417-426.*

* cited by examiner

*Primary Examiner*—George Fourson
(74) *Attorney, Agent, or Firm*—L. Cho

(57) ABSTRACT

A method of fabricating a non-volatile memory cell on a semiconductor substrate is disclosed. An area of a first region of the semiconductor substrate designated for a layer of floating polysilicon is blocked while a second region of the semiconductor substrate designated for a layer of non-floating polysilicon is exposed. Exposed regions of the semiconductor substrate are doped with charges.

25 Claims, 5 Drawing Sheets

US 7,291,546 B1

METHOD AND APPARATUS FOR REDUCING CHARGE LOSS IN A NONVOLATILE MEMORY CELL

RELATED APPLICATIONS

This application is a continuation of application Ser. No. 10/156,514 filed on May 28, 2002 now U.S. Pat. No. 6,773,987 which claims the benefit of the priority date of U.S. Provisional Application 60/332,718 filed on Nov. 17, 2001 under 35 U.S.C. § 119(e).

FIELD OF THE INVENTION

The present invention relates to the field of non-volatile memory devices such as electrically erasable programmable read-only memories (EEPROMs), and flash memories. More specifically, the present invention relates to a method and apparatus for improving charge retention in floating gate devices in non-volatile memory device cells.

BACKGROUND

Charge retention is an important characteristic of reliable non-volatile memory devices. The oxide surrounding the polysilicon of the floating gate device of a non-volatile memory cell serves as an insulator for preventing charge loss. Damage to oxide surrounding the polysilicon of floating gate devices has been associated with charge loss in non-volatile memory devices. Damage to the oxide may result, for example, from the actual doping of the oxide and/or from an increased chemical doping level of the polysilicon next to the oxide.

In the past, the application of a hard mask oxide was used to minimize damage to the oxide surrounding floating gate devices. The hard mask minimized damage on the oxide by isolating both the oxide and the polysilicon from doping processes such as those used for source drain implantation. Current salicide processes, however, utilize a layering process which involve application of a metal, such as titanium, over the polysilicon in order to lower the resistive properties of the polysilicon. This process prevents the application of the hard mask.

Thus, what is needed is a method and apparatus for addressing the problem of oxide damage along the polysilicon gate.

SUMMARY

A method and apparatus for reducing charge loss in a non-volatile memory cell is disclosed. A region forming a floating polysilicon structure in the non-volatile memory cell is selectively blocked during a doping process. The floating polysilicon structure may be selectively blocked by using a layer of photoresist, oxide, or other dopant blocking material. By selectively blocking a region forming the floating polysilicon structure, damage to the oxide that operates as an insulator for the floating polysilicon structure may be minimized. The region that is blocked may be an entire floating polysilicon layer or an outer edge of the floating polysilicon layer.

A method of fabricating a non-volatile memory cell on a semiconductor substrate according to a first embodiment of the present invention is disclosed. An area of a first region of the semiconductor substrate designated for a layer of floating polysilicon is blocked while a second region of the semiconductor substrate designated for a layer of non-floating polysilicon is exposed. Exposed regions of the semiconductor substrate are doped with charges.

A method of fabricating a non-volatile memory cell on a semiconductor substrate according to a second embodiment of the present invention is disclosed. A chemical polysilicon doping level of components in a floating polysilicon region of the semiconductor substrate is varied with a chemical polysilicon doping level of components in a non-floating polysilicon region of the semiconductor substrate.

A non-volatile memory cell according to an embodiment of the present invention is disclosed. The non-volatile memory cell includes a floating gate device, coupling gate capacitor, and tunneling capacitor having a first level of polysilicon doping. The non-volatile memory cell includes select transistors with a second level of polysilicon doping.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

A method and apparatus for reducing charge loss in a non-volatile memory cell is described. In the following description, numerous specific details are set forth, such as specific materials and processes, in order to provide a thorough understanding of the present invention. It should be appreciated that the invention may be practiced without these specific details. In other instances, well-known semiconductor equipment and processes have not been described in particular detail in order to avoid unnecessarily obscuring the present invention.

Figure 1:
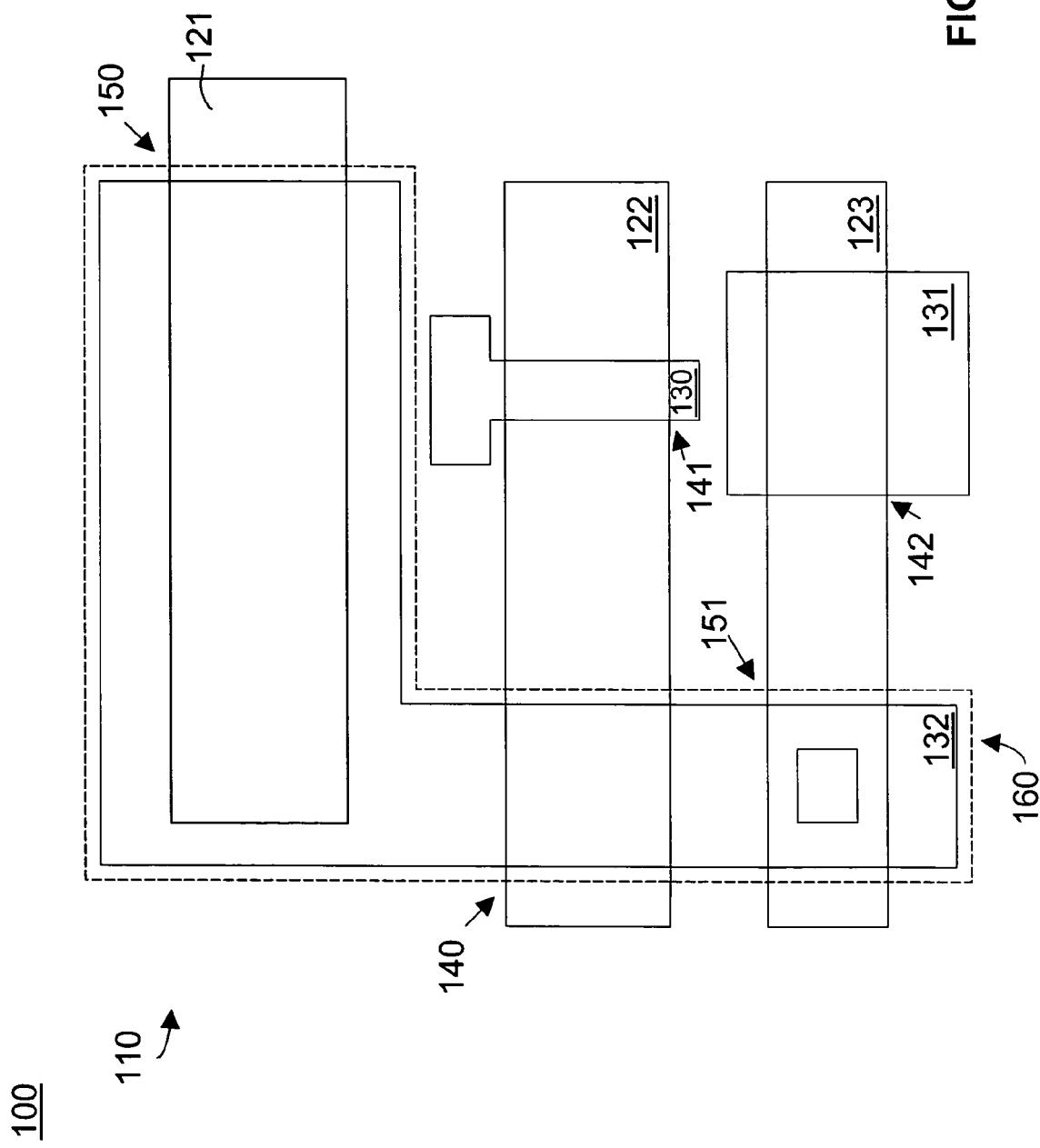
FIG. 1 illustrates a top down view of a non-volatile memory cell according to a first embodiment of the present invention.

FIG. 1 illustrates a non-volatile memory cell 110 on a semiconductor substrate 100 according to an embodiment of the present invention. The non-volatile memory cell 110 may be an electrically erasable programmable read-only memory (EEPROM). The semiconductor substrate 100 includes a plurality of active regions 121, 122, and 123. The active regions 121, 122, and 123 may be regions on the semiconductor substrate 100 that were masked during an isolation process where field oxide was formed on the semiconductor substrate 100.

The semiconductor substrate 110 includes a plurality of polysilicon regions 130, 131, and a floating polysilicon region 132. The polysilicon in polysilicon regions 130, 131, and floating polysilicon region 132 may be used to form the gate of transistors in the non-volatile memory cell 110. The intersection of the active regions 122 and 123 with polysilicon regions 130, 131 and floating polysilicon region 132 forms a plurality of transistors. The intersection of the active region 122 and the floating polysilicon region 132 forms a floating gate transistor or floating gate device 140. The intersection of the active region 122 and the polysilicon region 130 forms a select transistor for sensing 141. The intersection of the active region 123 and the polysilicon region 131 forms a select transistor for programming 142.

The polysilicon in the floating polysilicon region 132 may be used to form capacitors in the non-volatile memory cell 110. The intersection of the active regions 121 and 123 with the floating polysilicon region 132 forms a plurality of capacitors. The intersection of the active region 121 with the floating polysilicon region 132 forms a coupling gate capacitor 150. The intersection of the active region 123 with the floating polysilicon region 132 forms a tunneling capacitor 151. According to an embodiment of the present invention, the coupling gate capacitor 150 is larger than the tunneling capacitor 151.

The coupling gate capacitor 150 and the tunneling capacitor 151 are coupled together in series. A gate of the floating gate device 140 is coupled to a node between the coupling gate capacitor 150 and the tunneling capacitor 151. The select transistor for sensing 141 is coupled to the floating gate device 140. The select transistor for programming 142 is coupled to the tunneling capacitor 151. The floating gate device 140, coupling gate capacitor 150 and tunneling capacitor 151 make up what is referred to as a "floating polysilicon structure". The floating polysilicon structure may change the threshold voltage of the floating gate device 140 when the tunneling capacitor 151 traps an excess of electrons on the gate of the floating gate device 140. Fowler-Nordheim tunneling occurs when the gate of the floating gate device 140 is raised to a high voltage via capacitive coupling to an implant region (n+ implant region for an NMOS transistor, p+ implant region for a PMOS transistor). Once the electrons have been trapped on the gate of the floating gate device 140, they present a negative shielding voltage and increase the threshold voltage of the floating gate device 150. This makes it difficult to turn the floating gate device 140 on under normal operating voltages. This process allows the gate of the floating gate device 140 to operate as an on/off switch for the select transistor for sensing 141.

According to an embodiment of the present invention, the non-volatile memory cell 110 may be provided with an insulator region illustrated by dashed lines 160. The insulator region 160 may cover the floating polysilicon structure by covering/blocking the entire floating polysilicon region 132 and an area extending outside the floating polysilicon region 132 as shown. The area extending outside the floating polysilicon region 132 may include an oxide for insulating charge in the floating polysilicon gate. The insulator region 160 may be formed by using a photolithography process. This may involve covering the semiconductor substrate 100 with a photoresist material, covering the floating polysilicon region 132 and an area extending outside the floating polysilicon region 132 with a mask, and exposing the unmasked region of the semiconductor substrate 100 with ultraviolet light. Alternatively, the insulator region 160 may be formed using a layer of oxide. The oxide may be applied on the floating polysilicon region 132 and an area extending outside the polysilicon region, for example, during a salicide process.

According to an embodiment of the present invention, the insulator region 160 operates to block the floating polysilicon region 132 and oxide neighboring the floating polysilicon region 132 (not shown) during fabrication processes that involve doping. Fabrication processes that involve doping include semiconductor substrate doping to create n-type or p-type regions for the source and drain junctions of transistors, polysilicon pre-doping/doping used for reducing the resistive properties and increasing conductive properties of the polysilicon gate, polysilicon counter doping used for increasing the resistive properties and decreasing conductive properties of the polysilicon gate, and other doping processes. In an embodiment of the present invention where the insulator region 160 covers the entire floating polysilicon region 132, the insulator region 160 may be generated without requiring a complicated sizing algorithm for the mask on and around the floating polysilicon region 132.

Figure 2:
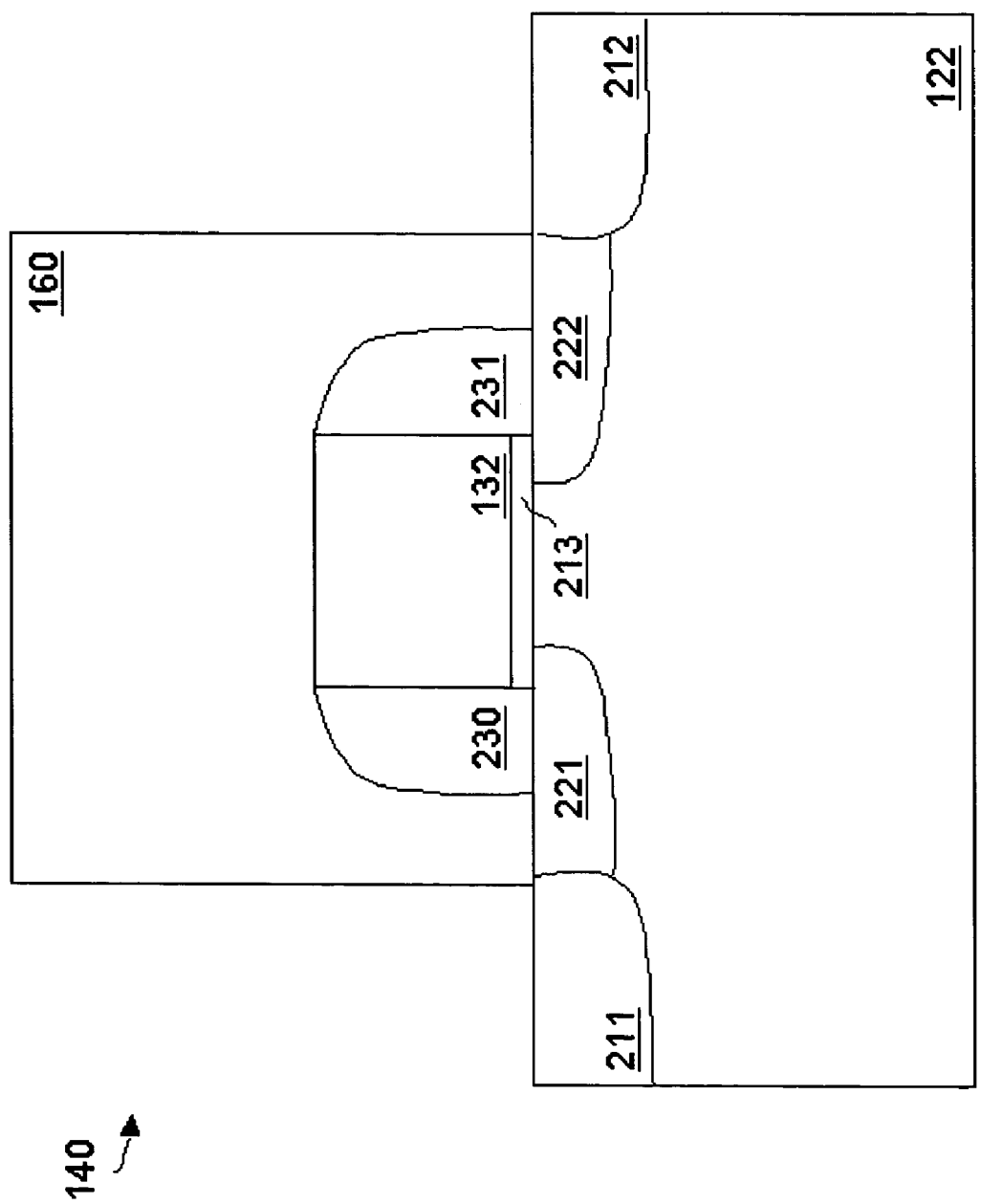
FIG. 2 illustrates a cross sectional view of a floating gate device shown in FIG. 1.

FIG. 2 illustrates a cross sectional view of the floating gate device 140 shown in FIG. 1. The floating gate device 140 is formed on an active region 122 of the semiconductor substrate 100 (shown in FIG. 1). The floating gate device 140 includes a polysilicon gate formed by a portion of the floating polysilicon 132 shown in FIG. 1. The polysilicon gate 132 is surrounded at its sides by spacers 230 and 231, formed by oxide, and at its bottom by gate dielectric 213. The oxide spacers 230 and 231, and gate dielectric 213 insulate charges in the polysilicon gate 132. The floating gate device 140 includes a source 211 and a drain 212. The floating gate device 140 may also include lightly doped drain regions 221 and 222 formed from doping the active region 122 of the semiconductor substrate 100 to decrease the resistive properties of the semiconductor substrate 100.

The insulator region 160 covers the top of the polysilicon gate 132 and the top and sides of the spacers 230 and 231. By using the insulator region 160 to block the floating polysilicon region 132 and spacers 230 and 231 from source drain implantantation, polysilicon doping/predoping processes, and other doping processes, oxide surrounding the polysilicon gate 132 is better preserved and charge retention of the non-volatile memory cell 110 (shown in FIG. 1) is improved.

The boundaries of the source 211 and the drain 212 line up with the edge of the insulator region 160. When the insulator region 160 is applied to block the doping process of forming the source 211 and drain 212, the lightly doped drain regions 221 and 222 are widen to extend from near an edge of the floating polysilicon region 132 to the edge of the insulator region 160. The wider lightly doped drain regions 221 and 222 increases the series resistance of the floating gate device 140. The reduction in the current due to the increase in the series resistance, however, is minimal due to the short and wide geometric characteristics of the floating polysilicon region 132.

Figure 3:
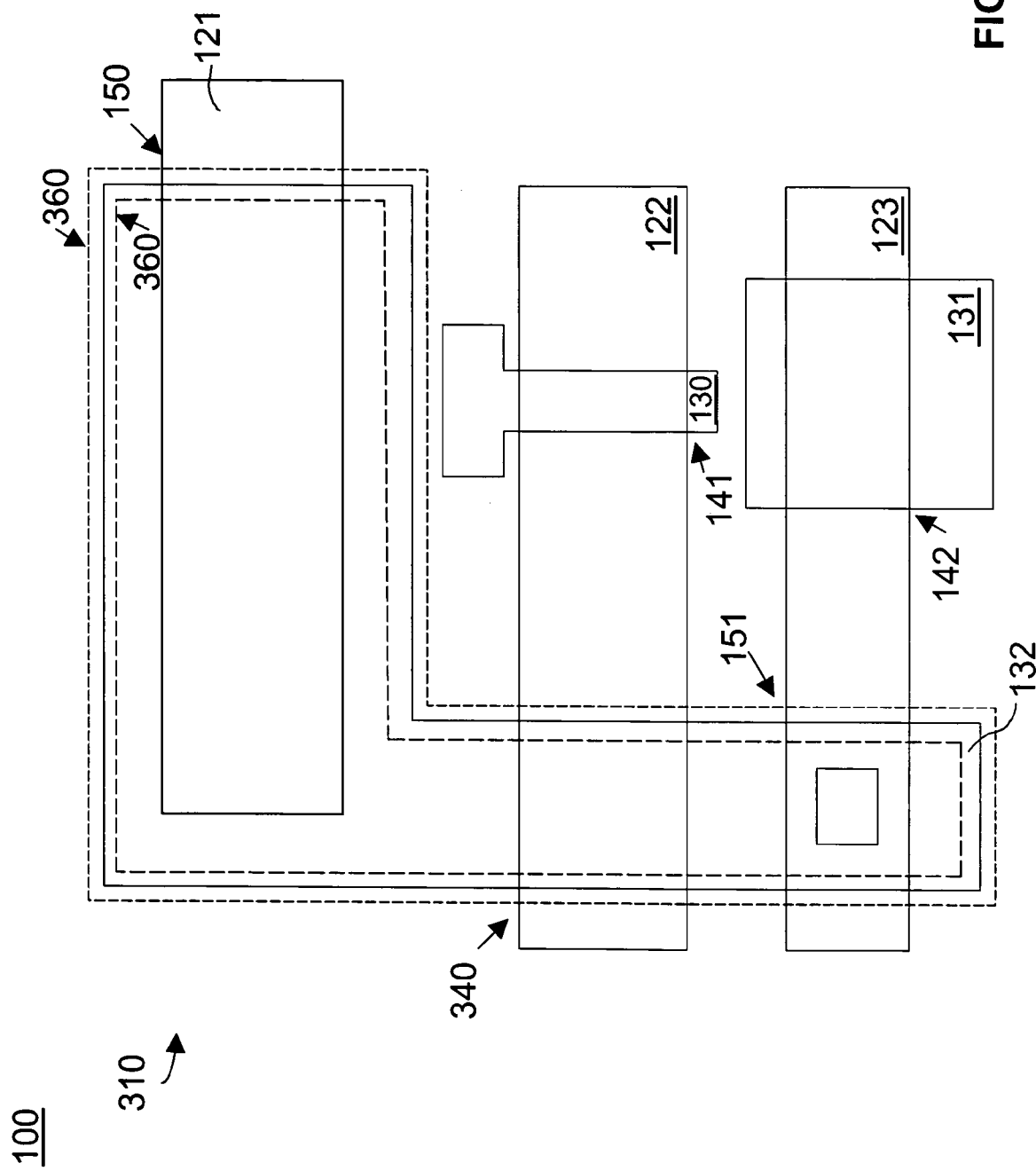
FIG. 3 illustrates a top down view of a non-volatile memory cell according to a second embodiment of the present invention.

FIG. 3 illustrates a top down view of a non-volatile memory cell 310 according to a second embodiment of the present invention. The non-volatile memory cell 310 is similar to the non-volatile memory cell 110 shown in FIG. 1 in that it includes many similar components. According to an embodiment of the present invention, the floating polysilicon region 132 may be provided with an insulator region illustrated by dashed lines 360. The insulator region 360 may cover the floating polysilicon structure by covering/blocking the outer edge of the floating polysilicon region 132 and an area extending outside the polysilicon region 132 as shown. The area extending outside the floating polysilicon region 132 may include an oxide for insulating charge in the floating polysilicon gate. Although the insulator region 360 exposes the inner/center portions of the floating polysilicon region 132, the insulator region 360 is still able to reduce the chemical polysilicion doping level of the floating polysilicion region 132.

The insulator region 360 may be formed by using a photolithography process. This may involve covering the semiconductor substrate 100 with a photoresist material, covering the outer edge of the polysilicon region 132 and an area extending outside the polysilicon region with a mask, and exposing the unmasked region of the semiconductor substrate with ultraviolet light. Alternatively, the insulator region 360 may be formed using a layer of oxide. The oxide may be applied on the entire or outer edge of the floating polysilicon region 132 and an area extending outside the polysilicon region, for example, during a salicide process.

According to an embodiment of the present invention, the insulator region 360 operates to block the floating polysilicon region 132 and oxide neighboring the floating polysilicon region 132 (not shown) during fabrication processes that involve doping. Fabrication processes that involve doping include specific semiconductor substrate doping to create n-type or p-type regions for the source and drain junctions of transistors, polysilicon pre-doping/doping used for reducing the resistive properties and increasing conductive properties of the polysilicon gate, polysilicon counter doping used for increasing the resistive properties and decreasing conductive properties of the polysilicon gate, and other doping processes.

Figure 4:
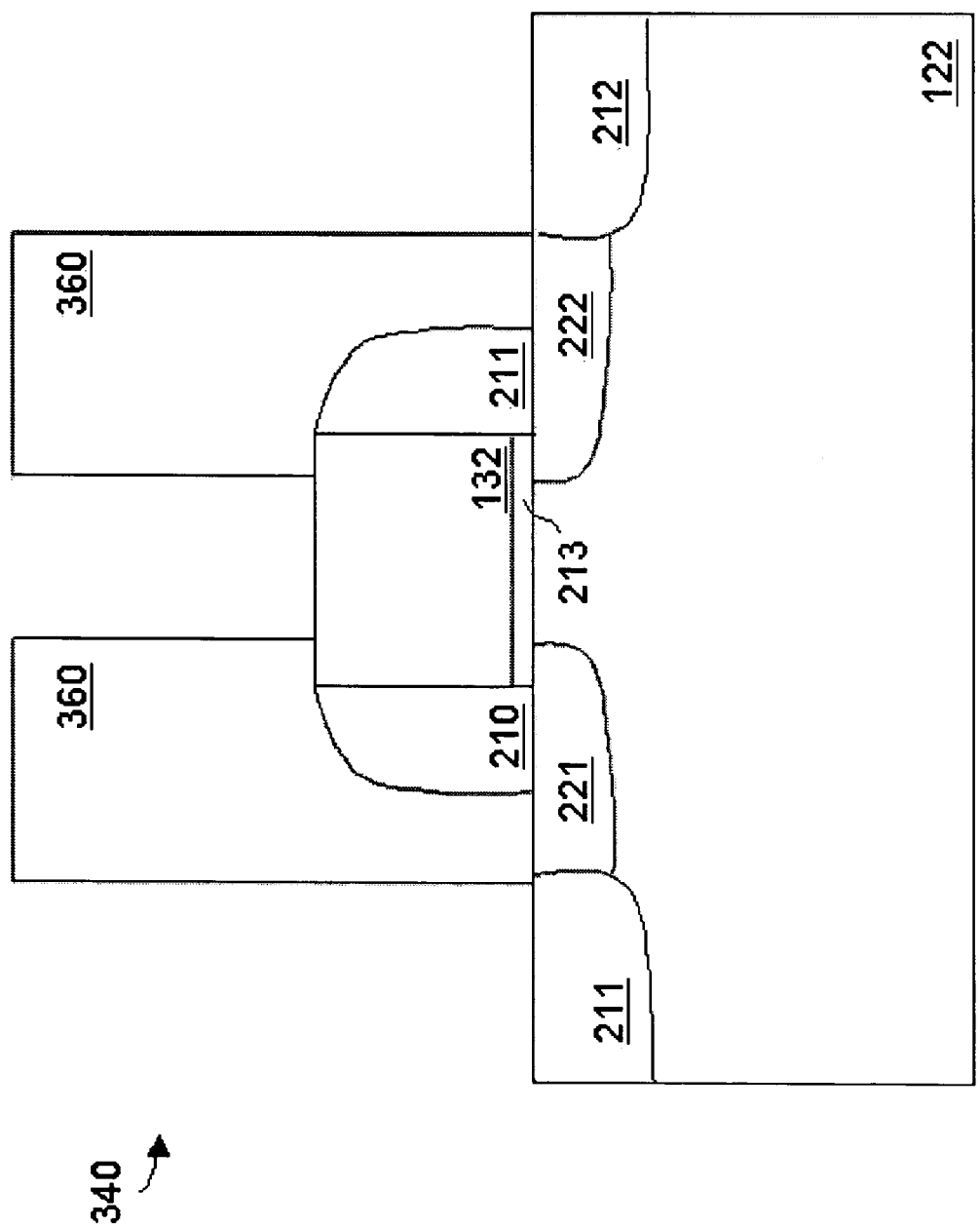
FIG. 4 illustrates a cross sectional view of a floating gate device shown in FIG. 3.

FIG. 4 illustrates a cross sectional view of the floating gate device 340 shown in FIG. 3. The floating gate device 340 is similar to the floating gate device 140 shown in FIG. 2 in that it includes many similar components. The insulator region 360 covers a portion of the top of the floating polysilicon 132 forming the gate and the top and sides of the spacers 210 and 211.

Figure 5:
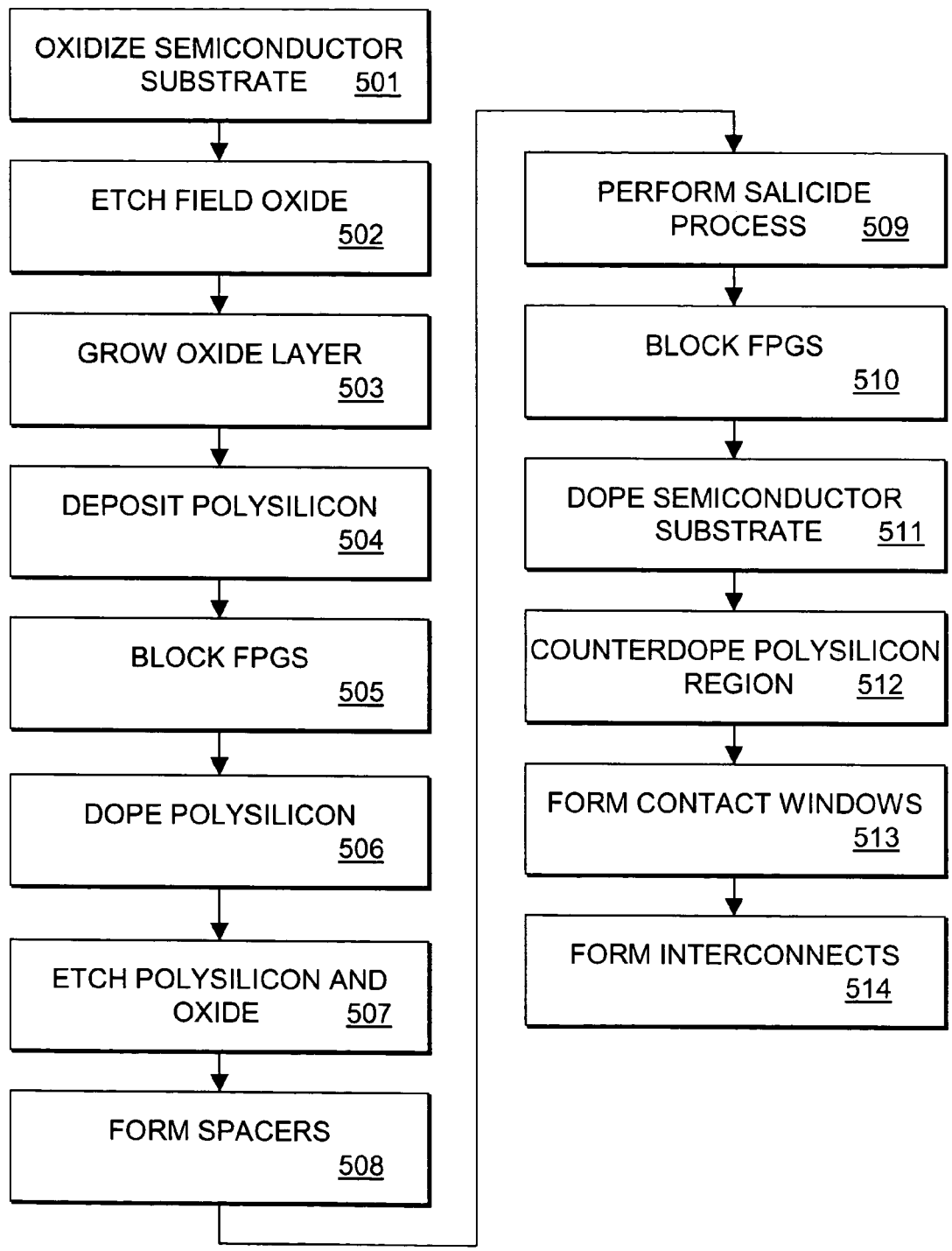
FIG. 5 is a flow chart that illustrates a method for fabricating a non-volatile memory cell on a semiconductor substrate according to an embodiment of the present invention.

FIG. 5 is a flow chart that illustrates a method for fabricating a non-volatile memory cell on a semiconductor substrate according to an embodiment of the present invention. At step 501, the semiconductor substrate is oxidized. The semiconductor substrate may be a silicon substrate. Oxidation of the silicon substrate may involve creating a layer of silicon dioxide (field oxide) on the surface of the silicon substrate.

At step 502, the field oxide is etched. The field oxide may be selectively etched to expose the silicon surface on which metal oxide semiconductor transistors and capacitors will be created.

At step 503, an oxide layer is grown. The oxide layer may be used as the dielectric for the capacitors and gate dielectric for the transistors in the non-volatile memory cell.

At step 504, a thin layer of polysilicon (polycrystalline silicon) is deposited on top of the oxide. Polysilicon may be used as gate electrode material for the metal oxide semiconductor transistors.

At step 505, a region of the semiconductor substrate designated for the floating polysilicon structure may be blocked. According to one embodiment, the region for the floating polysilicon structure may be blocked using a photolithography process. This may involve covering the semiconductor substrate with a photoresist material, covering the region for the floating polysilicon structure with a mask, and exposing the unmasked region of the semiconductor substrate to ultraviolet light. It should be appreciated that either positive or negative photoresist may be used in the photolithography process and that other techniques may be used to block a region for the floating polysilicon structure.

At step 506, the exposed polysilicon regions of the semiconductor substrate are doped. According to one embodiment, the polysilicon regions are doped with impurity atoms in order to reduce the resistive properties and increase the conductive properties of the polysilicon regions. It should be appreciated that steps 505 and 506 may be repeated together any number of times. For example, the fabrication process may repeat steps 505 and 506 twice where the first time step 706 is referred to as a pre-doping step and a second time step 706 is referred to as a doping step.

At step 507, the polysilicon layer and oxide layer are etched. The polysilicon layer may be patterned and etched to form the interconnects and the metal oxide semiconductor transistor gates. The oxide not covered by polysilicon may also be etched away to expose the bare silicon on which source and drain junctions are to be formed.

At step 508, oxide is deposited and patterned to form spacers for the transistors in the non-volatile memory cell.

At step 509, a salicide process is performed where polysilicon regions not designated for the floating polysilicon structure are deposited with titanium.

At step 510, a polysilicon region of the semiconductor substrate designated for the floating polysilicon structure may be blocked. The designated region for the floating polysilicon structure may be blocked using the techniques as described in step 505. Alternatively, the designated region for the floating polysilicon structure may be blocked by using an oxide mask utilized in the salicide process of step 509 to block titanium from the floating polysilicon structure.

At step 511, the semiconductor substrate is doped. The entire silicon surface may be doped with a high concentration of impurities, either through diffusion or ion implantation. The doping penetrates exposed areas on the silicon surface creating n-type or p-type regions (source and drain junctions) in the p-type or n-type substrate.

At step 512, polysilicon regions selected to have a reduced polysilicon doping level may be counter doped.

At step 513, contact windows are formed. The entire surface of the silicon substrate may be covered with an insulating layer of silicon dioxide. The insulating oxide layer may be patterned to provide contact windows for drain and source junctions.

At step 514, interconnects are formed. The surface of the semiconductor may be covered with a metal layer such as evaporated aluminum. The metal layer may be patterned and etched to form the interconnections of the metal oxide semiconductor transistors on the surface.

FIG. 5 illustrates a flow chart describing a methods for fabricating a non-volatile memory cell on a semiconductor substrate. Some of the steps illustrated in these figures may be performed in an order other than that which is described. It should be appreciated that not all of the steps described are required to be performed, that additional steps may be added, and that some of the illustrated steps may be substituted with other steps. For example, steps 705 and 710 may be used to vary the polysilicon doping level of selected transistors. It should be appreciated that both of these steps need not be used to vary the chemical polysilicon doping level of the floating polysilicon and that one may selectively choose one or both of these steps.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method of performing fabrication of a non-volatile memory cell on a semiconductor substrate, comprising:
   forming a floating polysilicon region and a non-floating polysilicon region;
   blocking a first area, that includes the entire floating polysilicon region and an area extending outside the floating polysilicon region, by covering a top and sides of the floating polysilicon region prior to any doping with a high concentration of dopants while exposing a second area that includes a non-blocked non-floating polysilicon region; and
   doping the second area with the high concentration of dopants, after blocking the first area, while leaving the first area undoped with the high concentration of dopants during the entire fabrication of the non-volatile memory, wherein the high concentration of dopants are capable of creating source and drain junctions.

2. The method of claim 1, wherein blocking the first area comprises:
   applying a photoresist over the semiconductor substrate;
   covering the layer of floating polysilicon with a mask; and
   applying ultraviolet light.

3. The method of claim 1, wherein blocking the first area comprises layering oxide over the first area.

4. The method of claim 1, wherein doping the second area comprises doping with dopants that reduce resistive properties of the second area.

5. The method of claim 1, wherein doping the second area comprises doping with dopants that increase resistive properties of the second area.

6. The method of claim 1, wherein doping comprises performing ion implantation.

7. The method of claim 1, wherein the floating polysilicon region is designated for a floating gate device, coupling gate capacitor, and tunneling capacitor for the non-volatile memory cell.

8. The method of claim 1, wherein select transistors are formed on the non-floating polysilicon region.

9. A method of performing fabrication of a non-volatile memory cell on a semiconductor substrate, comprising:
   forming a floating polysilicon region and a non-floating polysilicon region;
   blocking a first area that includes the floating polysilicon region, by applying a photoresist to a top and sides of the floating polysilicon region prior to any doping with a high concentration of dopants, while exposing a second area that includes a non-blocked non-floating polysilicon region; and
   doping the second area with the high concentration of dopants while leaving the first area undoped with the high concentration of dopants during the entire fabrication of the non-volatile memory, wherein the high concentration of dopants are capable of creating source and drain junctions.

10. The method of claim 9, wherein blocking the first area further comprises:
    covering the first area with a mask; and
    applying ultraviolet light.

11. The method of claim 9, wherein doping the second area comprises doping with dopants that reduce resistive properties of the second area.

12. The method of claim 9, wherein doping the second area comprises doping with dopants that increase resistive properties of the second area.

13. The method of claim 9, wherein doping comprises performing ion implantation.

14. The method of claim 9, wherein doping comprises performing thermal diffusion.

15. The method of claim 9, wherein the first area includes an area extending outside the floating polysilicon region.

16. A method of performing fabrication of a non-volatile memory cell on a semiconductor substrate, comprising:
    forming a floating polysilicon region and a non-floating polysilicon region;
    blocking a first area that includes the floating polysilicon region, by layering oxide over a top and sides of the floating polysilicon region in the first area prior to any doping with a high concentration of dopants, while exposing a second area that includes a non-blocked non-floating polysilicon region; and
    doping the second area with the high concentration of dopants while leaving the first area undoped with the high concentration of dopants during the entire fabrication of the non-volatile memory, wherein the high concentration of dopants are capable of creating source and drain junctions.

17. The method of claim 16, wherein doping the second area comprises doping with dopants that reduce resistive properties of the second area.

18. The method of claim 16, wherein doping the second area comprises doping with dopants that increase resistive properties of the second area.

19. The method of claim 16, wherein doping comprises performing ion implantation.

20. The method of claim 16, wherein doping comprises performing thermal diffusion.

21. The method of claim 16, wherein the first area includes an area extending outside the floating polysilicon region.

22. A method of performing fabrication of a non-volatile memory cell on a semiconductor substrate, comprising:
    forming a floating polysilicon region and a non-floating polysilicon region;
    blocking a first area, that includes only an outer edge surrounding the polysilicon region, while exposing a second area that includes a non-blocked non-floating polysilicon region; and
    doping the second area with dopants.

23. The method of claim 9, wherein blocking the first area comprises covering the top and sides of the floating polysilicon region.

24. The method of claim 9, wherein blocking the first area comprises applying photoresist.

25. The method of claim 9, wherein blocking the first area comprises layering oxide over the first area.

* * * * *